United States Patent
Waible

(10) Patent No.: US 7,209,010 B2
(45) Date of Patent: Apr. 24, 2007

(54) OSCILLATOR WITH TUNABLE DIFFUSION CAPACITANCE AS RESONANT CIRCUIT CAPACITANCE

(75) Inventor: Hans-Peter Waible, Flein (DE)

(73) Assignee: Atmel Germany GmbH, Heilbronn (DE)

(*) Notice: Subject to any disclaimer, the term of this patent is extended or adjusted under 35 U.S.C. 154(b) by 92 days.

(21) Appl. No.: 11/094,534

(22) Filed: Mar. 31, 2005

(65) Prior Publication Data
US 2005/0219005 A1    Oct. 6, 2005

(30) Foreign Application Priority Data
Apr. 2, 2004    (DE) .................. 10 2004 017 788

(51) Int. Cl.
H03L 7/09      (2006.01)
H03B 5/08      (2006.01)
H03B 5/18      (2006.01)

(52) U.S. Cl. ............... 331/36 C; 331/105; 331/117 R; 331/167; 331/177 V

(58) Field of Classification Search .............. 331/36 C, 331/177 V, 179, 117 R, 117 FE, 167
See application file for complete search history.

(56) References Cited

U.S. PATENT DOCUMENTS

| 3,737,807 A | 6/1973 | Parham |
| 5,187,450 A | 2/1993 | Wagner et al. |
| 5,680,073 A | 10/1997 | Nathan et al. |
| 5,929,716 A | 7/1999 | Komori et al. |
| 6,114,919 A | 9/2000 | Ajjikuttira et al. |
| 6,509,799 B1 | 1/2003 | Franca-Neto |
| 6,850,122 B2 * | 2/2005 | Ravi et al. ............. 331/46 |
| 2003/0030495 A1 | 2/2003 | Franca-Neto |

FOREIGN PATENT DOCUMENTS

| DE | 102 09 517 A1 | 6/2003 |
| DE | 102 09 867 A1 | 10/2003 |
| EP | 0 657 993 A1 | 6/1995 |
| EP | 0 663 723 B1 | 7/1995 |

* cited by examiner

Primary Examiner—Robert Pascal
Assistant Examiner—James Goodley
(74) Attorney, Agent, or Firm—McGrath, Geissler, Olds & Richardson, PLLC

(57) ABSTRACT

An oscillator includes a resonant circuit of at least one inductance device and at least one tunable capacitance. The tunable capacitance is implemented through diffusion capacitances of at least one current-carrying transistor. The tunable capacitance has a first differential amplifier having a first transistor and a second transistor and a second differential amplifier having a third transistor and a fourth transistor Electrical properties of the first transistor and second transistor are complementary to electrical properties of the third transistor and fourth transistor, and control connections of the first transistor and the third transistor are connected to one another. Control connections of the second transistor and the fourth transistor are connected to one another. Second current connections of the first transistor and the third transistor are connected to one another, and second current connections of the second transistor and the fourth transistor are connected to one another.

18 Claims, 3 Drawing Sheets

OSCILLATOR WITH TUNABLE DIFFUSION CAPACITANCE AS RESONANT CIRCUIT CAPACITANCE

This nonprovisional application claims priority under 35 U.S.C. § 119(a) on German Patent Application No. DE 102004017788.0, which was filed in Germany on Apr. 2, 2004, and which is herein incorporated by reference.

BACKGROUND OF THE INVENTION

1. Field of the Invention

The present invention relates to an oscillator with a resonant circuit of at least one inductance device and at least one tunable capacitance, wherein the tunable capacitance is implemented through diffusion capacitances of at least one current-carrying transistor.

2. Description of the Background Art

Diffusion capacitances arise when pn junctions are operated in the forward-biased direction. The diffusion capacitance results from the fact that, in forward-biased operation, the pn junction is flooded with charge carriers. This has the result that majority charge carriers migrate into the region of opposite doping. They remain there as minority carriers for a certain period of time before recombining. But until recombination, they travel further, traversing a recombination distance, resulting in a spatial separation of charge. A pn junction operated in the forward-biased direction with charge carriers stored in this manner therefore represents a capacitance.

The diffusion capacitance, which arises only with current flow, is to be distinguished from depletion layer capacitance, which is also formed at a reverse-biased pn junction due to static space charge. Depletion layer capacitances depend on an applied reverse voltage and the design of the diode, hence the depletion layer area, the semiconductor material and the doping. The capacitances are typically in the picofarad range, and vary nonlinearly as a factor $U_R^{-0.5}$ of the applied voltage $U_R$.

In general, non-parallel-connected depletion layer capacitances, which is to say variable-capacitance diodes operated in the reverse-bias direction or specially grown varactor diodes, have been used to date for tuning resonant circuits. Variable-capacitance diodes are diodes in which the voltage dependence of the depletion layer capacitance is intentionally exploited. They embody variable, voltage-controlled capacitances. The basic material nowadays is primarily silicon, with gallium arsenide also being used for special applications. The depletion layer capacitance forms a component of the resonant circuit capacitance, which can be varied by a control voltage. Minimum capacitance is achieved at the largest reverse voltage. Maximum capacitance is achieved at the smallest reverse voltage. Varactor diodes are in principle high-power variable-capacitance diodes. The distortions arising in a resonant circuit due to the nonlinear capacitance curve c=f(U) during modulation with relatively large HF voltages are intentionally exploited here. The resulting harmonics are filtered out, and frequency multiplier circuits are designed in this way.

Because of their relatively low capacitance, diodes have a large area. Consequently, they use a great deal of chip area, and capacitive coupling through the substrate becomes increasingly critical as the size of the individual components increases. The size of the tuning range is proportional to the area, so the danger of coupling grows with the size of the tuning range. The substrate becomes ever more capacitive with increasing frequency, so coupling also becomes more likely with increasing frequency.

In order to avoid these disadvantages, diffusion capacitances are also used to tune resonant circuits. With identical components, the diffusion capacitance is significantly larger in numeric terms than the depletion layer capacitance, and is on the order of magnitude of a few hundred picofarads to a few hundred nanofarads.

Thus, the use of diffusion capacitances permits a reduction in the chip area required. An oscillator of the aforementioned type that operates with diffusion capacitances is known from U.S. Pat. No. 6,114,919. This document discloses an LC network of an inductance device and a resonant circuit capacitance, which is determined by the sum of the capacitances between a certain node (node 1) of the circuit and a reference potential (ground). This sum includes the diffusion capacitances of a transistor pair wired as differential amplifiers and the capacitance of a control transistor in an amplifying branch of the circuit. A change in the control current through the control transistor thus inevitably results in a change in the current through the transistors of the differential amplifier, displacing the operating point of these transistors. As a result, undesirable saturation effects, an undesirable change in the amplitude of oscillation, and a modulation of the noise properties of the resonant circuit can occur.

SUMMARY OF THE INVENTION

It is therefore an object of the present invention to provide an oscillator in which the aforementioned disadvantages are eliminated or at least reduced.

This object is attained in an oscillator having a tunable capacitance that has an arrangement of a first differential amplifier having a first transistor and a second transistor, and a second differential amplifier having a third transistor and a fourth transistor. Electrical properties of the first and second transistors are complementary to electrical properties of the third and fourth transistors. Control connections of the first transistor and the complementary third transistor are connected to one another, control connections of the second transistor and the complementary fourth transistor are connected to one another, second current connections of the first transistor and the third transistor are connected to one another, and second current connections of the second transistor and the fourth transistor are connected to one another.

In accordance with the invention, the variable capacitance thus can have two differential amplifiers in a series-opposed connection. The connection of the differential amplifiers can easily be varied and depends largely on the application and the requirements. The basic structure can be substantially identical. As a result of changing current distribution/modulation, each of the differential amplifiers constitutes a capacitance having series-connected diffusion capacitances. Through the cascading of mutually complementary transistors (PNP and NPN for bipolar transistors or N-channel and P-channel for field-effect transistors), the circuit can be dimensioned such that the control currents (or control signals in the case of field-effect transistors) nearly compensate one another and the capacitance has practically no effect on the biasing/operating point of the amplifying branch of the oscillator. A further advantage of the cascaded arrangement of complementary transistors is that the control current is utilized twice, for example in a PNP differential amplifier and then in an NPN differential amplifier. This reduces the current consumption needed as a consequence of the diffusion capacitances, which only arise with the flow of current.

A further advantage of the invention is that disruptions in supply voltages are not transmitted to the capacitances directly, but only as a function of the Early voltage, so that the effect of these disruptions is reduced in general.

The Early effect is understood to refer to a slight increase in collector current when a reverse voltage between collector and emitter is increased in normal amplifier operation. The Early effect is known to result from base width modulation due to the enlargement of the depletion layers. The depletion layer and thus the resistance between base and emitter increases with increasing voltage between collector and emitter. This is a minor effect. It is caused by an enlargement of the base-collector space-charge region with increasing reverse bias on the base-collector junction, which reduces the effective base width and increases the steepness of the curve of minority carrier concentration in the base. Since this concentration is proportional to the collector current IC, IC rises.

In addition, an inductance device and the tunable capacitance can be connected in parallel with one another.

The base-emitter and base-collector diffusion capacitances of bipolar transistors act as capacitances, for example. As a result of the circuit arrangement, in the resonant state the charge oscillates back and forth between the inductance device and these capacitances without the presence of comparably large charge movements in the supply lines, a circumstance that likewise reduces the current consumption.

The first differential amplifier and the second differential amplifier can also be wired in series between a first direct current source and a second direct current source, with the first direct current source feeding a current of variable magnitude into the arrangement and the second direct current source drawing a current of variable magnitude out of the arrangement.

The direct current sources modulate the capacitances and thereby permit control of the diffusion capacitances. It is especially advantageous in this regard that the control is independent of the compensation of the oscillator.

The magnitudes of the currents supplied by the first direct current source and the second direct current source can be equal.

As a result of such an arrangement, the second direct current source only draws from the differential amplifier arrangement the current that is supplied to the arrangement by the first direct current source. As a result, undesirable interactions between the control currents of the direct current sources and the resonant circuit currents flowing between the inductance device and capacitance are avoided to the greatest degree possible.

The first direct current source can be connected to first current connections of the first and second transistors and the second direct current source can be connected to first current connections of the third and fourth transistors.

As a result of this arrangement, the current supplied by the direct current sources distributes itself reciprocally between the two respective transistors of one of the two differential amplifiers as a function of the respective modulation of the transistors, which similarly minimizes an undesirable interaction of the control current with the resonant circuit current which could arise from current flowing through the bases.

Another embodiment, is characterized by bipolar transistors as first, second, third and fourth transistor, wherein a base of each of the transistors serves as the control connection, an emitter connection of each individual transistor serves as the first current connection, and a collector of each individual transistor serves as the second current connection.

An alternative embodiment is characterized by field-effect transistors as first, second, third and fourth transistor, wherein a gate terminal of each of the transistors serves as the control connection, a source terminal of each individual transistor or a drain terminal of each individual transistor serves as the first current connection, and a drain terminal or source terminal of each individual transistor serves as the second current connection.

Field-effect transistors are characterized by even smaller space requirements on the chip.

In another embodiment, a negative resistance can compensate the resonant circuit and can be decoupled from the control current that sets the value of the diffusion capacitances.

The negative resistance restores to the resonant circuit losses that are radiated or caused by ohmic resistances. The decoupling from the control current prevents undesirable interaction between the control current and the current flowing in the amplifying branch.

The inductance device and the capacitance can be connected in parallel between a first supply voltage and the negative resistance.

This embodiment also represents a measure for decoupling the control current from amplifying currents and reduces undesirable interactions between the resonant circuit and the control current.

The control connection of at least one of the transistors can be connected to the second current connection of the at least one transistor.

Through this embodiment, one of the diffusion capacitances of a transistor, in the case of a bipolar transistor the base-emitter capacitance, is short-circuited, reducing the contribution of the base-collector diffusion capacitances. However, it has proven to be advantageous that, as a result, the quality of the remaining tuning capacitance, in the case of a bipolar transistor the quality of the base-emitter diffusion capacitance, improves.

In an alternate embodiment, the inductance device can be divided into at least one first partial inductance device and at least one second partial inductance device.

This measure improves the biasing, and thus the operating point setting of the oscillator.

Also, the negative resistance can be implemented as a third differential amplifier having a fifth transistor, a sixth transistor and a constant current source. A second current connection of the fifth transistor and a control connection of the second transistor are connected to the first partial inductance device. A second current connection of the sixth transistor and a control connection of the fifth transistor are connected through a capacitance to the second partial inductance device. A control connection of the sixth transistor is connected through a capacitance to the first partial inductance device, and the constant current source is connected between first current connections of the fifth and sixth transistors and a second supply voltage.

A compensation circuit in the form of such a negative resistance thus represents an alternating current source with a capacitive cross-coupling of the collectors and bases of a differential pair of transistors, which supplies the resonant circuit with properly phased energy and thereby replaces damping losses of the resonant circuit.

In another embodiment, an additional capacitance can be wired between the second current connections of the fifth and sixth transistors, and thus in parallel to the resonant circuit inductance device.

This separate capacitance, which is independent of a control voltage, ensures rapid startup of the oscillator.

Additionally, an ohmic resistance can be connected between the first supply voltage and the parallel circuit of the inductance device and the tunable capacitance.

This ohmic resistance makes it possible to set the operating point of the oscillator.

In another preferred embodiment, a first series connection and a second series connection has two resistances each. The first series connection joins the second current connections of the first transistor and the third transistor, and the second series connection of two resistances each join the second current connections of the second transistor and the fourth transistor.

These series connections make it possible to optimize the tuning ranges of the variable capacitance for the relevant application.

In this context, a center tap of the first series connection can be connected to the control connections of the first transistor and the third transistor, and a center tap of the second series connection can be connected to the control connections of the second transistor and the fourth transistor.

This measure makes it possible in the case of bipolar transistors, for example, to implement the aforementioned short circuiting of base-collector capacitances by simple circuit design means.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
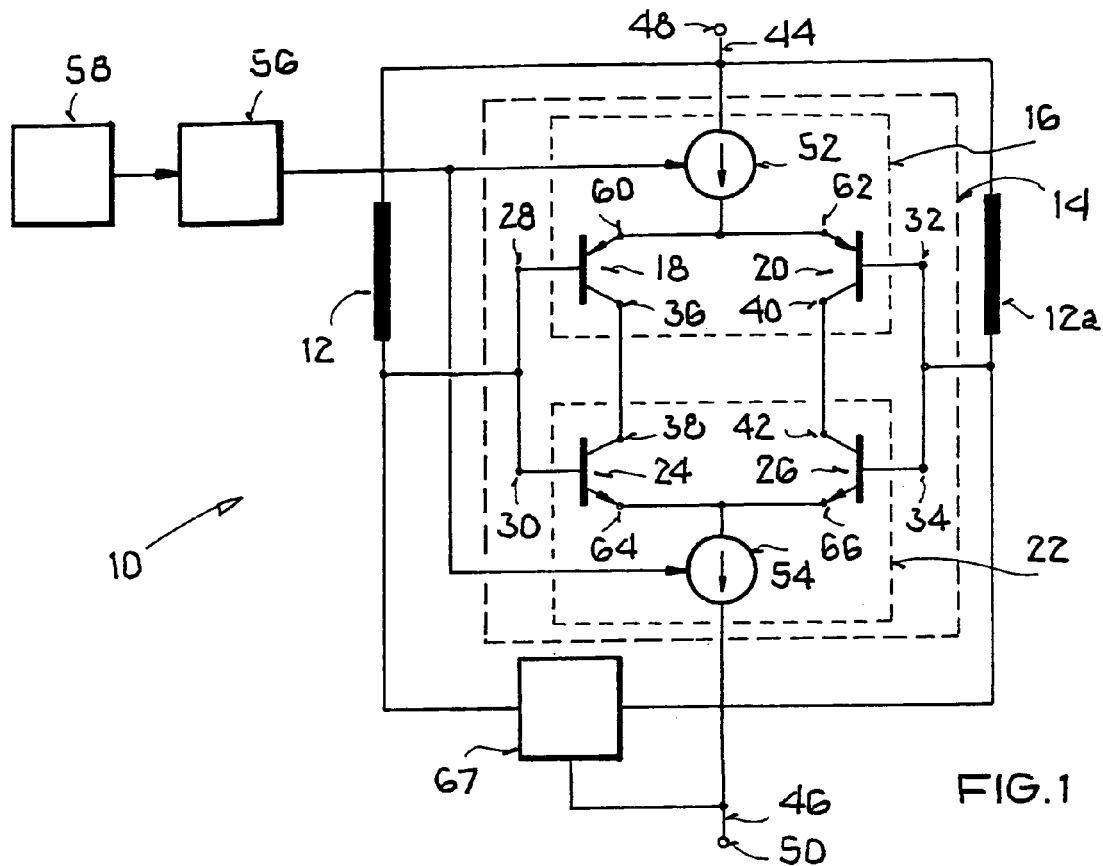
FIG. 1 shows a first example embodiment of an oscillator having a tunable capacitance in the form of a network of bipolar transistors.
Figure 2:
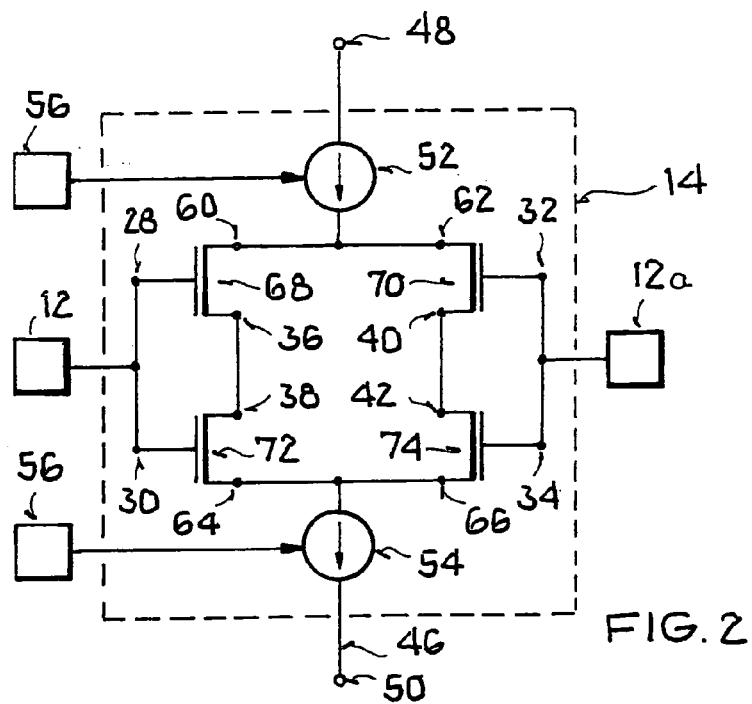
FIG. 2 shows an alternative embodiment of a tunable capacitance having a network of field-effect transistors.

FIG. 1 shows in detail an oscillator 10 having a resonant circuit of at least one inductance device 12, 12a and at least one tunable capacitance 14. Inductance devices 12, 12a may be any component or network known to one of ordinary skill in the art having the properties of an inductor. Examples may include coil-type inductors, electronic networks having inductive impedances (e.g., Gyrator circuits), etc. The tunable capacitance 14 can have diffusion capacitances of at least one current-carrying transistor. The tunable capacitance 14 can have an arrangement of a first differential amplifier 16 having a first transistor 18 and a second transistor 20, and a second differential amplifier 22 having a third transistor 24 and a fourth transistor 26. In this context, the transistors 18, 20, 24, 26 are selected such that the electrical properties of the first transistor 18 and second transistor 20 are of the same type, and simultaneously are complementary to electrical properties of the third transistor 24 and fourth transistor 26, which likewise represent the same type. In this context, type of electrical properties is understood to mean essentially the division of bipolar transistors into NPN and PNP transistors and the division of field-effect transistors into N-channel and P-channel transistors. A control connection 28 of the first transistor 18 is connected to a control connection 30 of a complementary third transistor 24. Similarly, a control connection 32 of the second transistor 20 is connected to a control connection 34 of the complementary fourth transistor 26. In the case of bipolar transistors such as are shown in FIG. 1, the control connections 28, 30, 32, 34 are base connections. In the case of field-effect transistors, as shown in FIG. 2, the control connections 28, 30, 32, 34 are gate terminals.

In addition, a second current connection 36 of the first transistor 18 is connected to a second current connection 38 of the third transistor 24, and a second current connection 40 of the second transistor 20 is connected to a second current connection 42 of the fourth transistor 26.

Inductance devices 12, 12a and the tunable capacitance 14 are connected in parallel to one another. When bipolar transistors are used as transistors 18, 20, 24, 26 base-emitter and base-collector diffusion capacitances function as resonant circuit capacitances, for example. As a result of the circuit arrangement, the charge in the resonant state oscillates back and forth between the inductance device 12 and these capacitances without the presence of comparably large charge movements in supply lines 44 and 46, which supply the oscillator 10 with a supply voltage 48, for example 3 volts, and a second supply voltage 50, for example zero volts=ground.

In this context, an arrangement of the first differential amplifier 16 and the second differential amplifier 22 is wired in series between a first direct current source 52 and a second direct current source 54, with the first direct current source 52 feeding a current of variable magnitude into the arrangement and the second direct current source 54 drawing a current of variable magnitude out of the arrangement.

The direct current sources 52, 54 modulate the capacitances and thereby permit control of the resonant circuit capacitance, and thus the frequency of the oscillator 10. A control unit 56 sets the current of the direct current sources 52, 54. The control unit 56 can be, for example, a computer that varies the frequency of the oscillator 10 as a function of a frequency requirement from a sensor 58. The sensor 58 can be, for example, a phase frequency detector (PFD), a phase locked loop (PLL), etc. If the sensor 58 is implemented as, for example, a PFD, the frequency that is supplied by the oscillator can be compared with a fraction of a reference frequency and creates an error signal when deviations occur. From such an error signal, the control unit 56 can create a control signal that alters the frequency of the oscillator in such a way that the error signal disappears or at least becomes smaller. In other words, the sensor 58, e.g., in this case, the PFD, always produces an error signal when the frequencies and/or phase positions of the oscillator signal and a split error signal are different. Depending on, for example, whether edges of the split oscillator signal lead or trail edges of the split reference signal, the PFD and/or the control unit 56 produce different control signals (e.g., up, down). Depending on these control signals, a charge pump, which can be integrated in the control unit 56, charges or discharges, for example, a capacitor, the voltage of which can be smoothed via a loop filter and can then be supplied to the oscillator as a control voltage.

In the control unit 56, the magnitudes of the currents supplied by the first direct current source 52 and the second direct current source 54 are kept equal, so that the second direct current source 54 only draws from the arrangement of the differential amplifiers 16, 22 the current that is supplied to the arrangement by the first direct current source 52. As a result, undesirable interactions between the control current of the direct current sources 52, 54 and the resonant circuit currents flowing between the inductance device 12 and the capacitance 14 are avoided to the greatest degree possible.

The first direct current source 52 is connected to first current connections 60, 62 of the first transistor 18 and the second transistor 20, respectively, while the second direct current source 54 is connected to first current connections 64, 66 of the third transistor 24 and the fourth transistor 26, respectively. As a result of this method of connection, the current supplied by the direct current sources 52, 54 distributes itself reciprocally between two transistors 18, 20 and 24, 26 of one of the two respective differential amplifiers 16, 22 as a function of the respective modulation of the transistors 18, 20, 24, 26, which minimizes an undesirable interaction of the control current with resonant circuit currents which could arise from current flowing through control connections 28, 32, 30, 34.

FIG. 1 shows an implementation of the capacitance 14 through diffusion capacitances of bipolar transistors 18, 20, 24, 26. In this case, the base of each of the transistors 18, 20, 24, 26, respectively, serves as the control connection 28, 32, 30, 34. Correspondingly, the emitters serve as first current connections 60, 62, 64, 66 and the collectors serve as second current connections 36, 40, 38, 42. The resonant circuit of the inductance device 12 and capacitance 14 is compensated by a negative resistance 67 that is decoupled from the control current that sets the value of the diffusion capacitances. The negative resistance restores to the resonant circuit losses that are radiated or caused by ohmic resistances. The decoupling from the control current prevents undesirable interaction between the control current and the current flowing in the amplifying branch. In this context, the inductance device 12 and the capacitance 14 are connected in parallel between the first supply voltage 48 and the negative resistance 67.

FIG. 2 shows an alternative embodiment of the capacitance 14 of FIG. 1 by a network of field-effect transistors 68, 70, 72, and 74. The control connections 28, 30, 32, 34 and the first current connections 60, 62, 64, 66 as well as the second current connections 36, 40, 38, 42 are labeled with the same reference symbols as in the case of the bipolar transistors 18, 20, 24, 26 from FIG. 1. It is a matter of course that the control connections 28, 30, 32, 34 from FIG. 2 are gate terminals while the first current connections 60, 62, 64, 66 are, for example, drain terminals and the second current connections 36, 40, 38, 42 are, for example, source terminals. As a result of the high symmetry of field-effect transistors, drain and source terminals are interchangeable.

Figure 3:
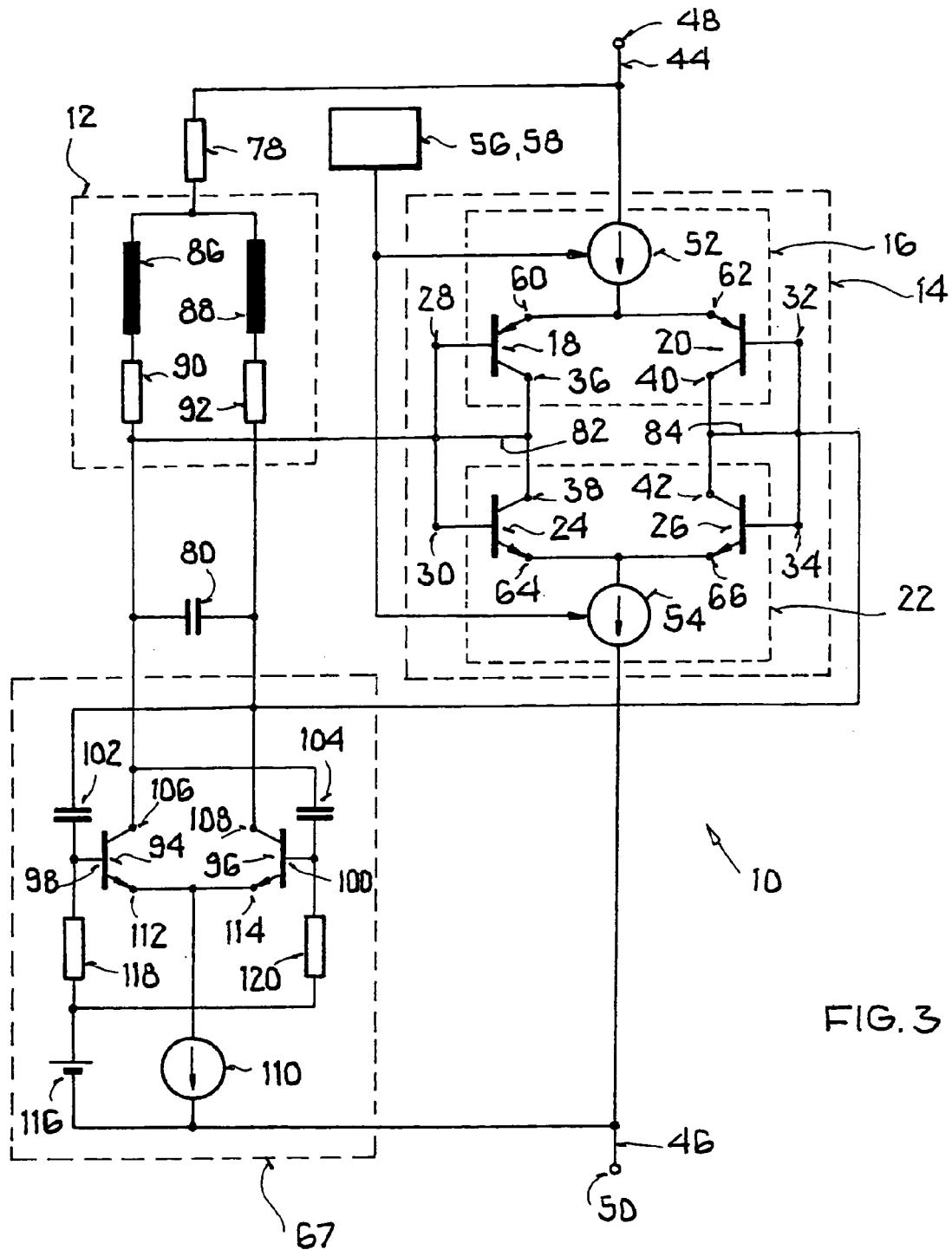
FIG. 3 shows an additional example embodiment of an oscillator according to an embodiment of the present invention.

FIG. 3 shows a further example embodiment of an inventive oscillator 10, where identical reference symbols in FIGS. 1 and 3 each designate identical elements. The subject matter of FIG. 3 differs from the subject matter of FIG. 1 by an altered inductance device 12, an altered capacitance 14, a detailed circuit of a negative resistance 67, an additional resistance 78 between the inductance device 12 and the first supply voltage 48, and a separate resonant circuit capacitance 80.

The change in the capacitance 14 can be a short-circuiting of the control connections 28, 30, 32, 34 of the transistors 18, 20, 24, 26 to associated second current connections 36, 38, 40, 42 through additional line segments 82 and 84. While this embodiment reduces the total value of the capacitance 14, it improves the quality of the remaining tuning capacitance.

The change in the inductance device 12 can be a division into two partial inductance devices 86, 88, which improves biasing, which is to say the operating point setting, of the oscillator 10. In this context, the resistances 90 and 92 represent ohmic components of the impedance of the inductance device 12. The aforementioned resistance 78 between the first supply voltage 48 and the parallel circuit of the inductance device 12 and tunable capacitance 14 is used to set the operating point of the oscillator 10.

FIG. 3 additionally shows the negative resistance 67 for compensating the resonant circuit. The negative resistance 67 in FIG. 3 has a differential amplifier having a differential pair of a fifth transistor 94 and a sixth transistor 96, whose control connections 98, 100 are cross-coupled to second current connections 106, 108, e.g. collectors, of the transistors 94, 96. The transistors 94, 96 of the third differential amplifiers are supplied by a constant current source 110, which is connected between first current connections (e.g., emitters) 112, 114 of the transistors 94, 96 and the second supply voltage 50. A voltage source 116, together with resistances 118, 120, determines the operating point of the third differential amplifier. In addition, the second current connections 106, 108 are both connected to the partial inductance devices 86, 88 of the inductance device 12 and to control connections 28, 30, 32, 34 of the tunable capacitance 14. Such a negative resistance 67 thus represents an alternating current source with a capacitive cross-coupling of the collectors and bases of a differential amplifier, which supplies the resonant circuit with properly phased energy and thereby replaces damping losses of the resonant circuit.

The separate capacitance 80 that is wired between the second current connections 106, 108 of the fifth transistor 94 and the sixth transistor 96, and thus in parallel to the resonant circuit capacitance 14 and the inductance device 12, is independent of the capacitance 14 that is tunable by the control current, and ensures rapid startup of the oscillator 10.

Figure 4:
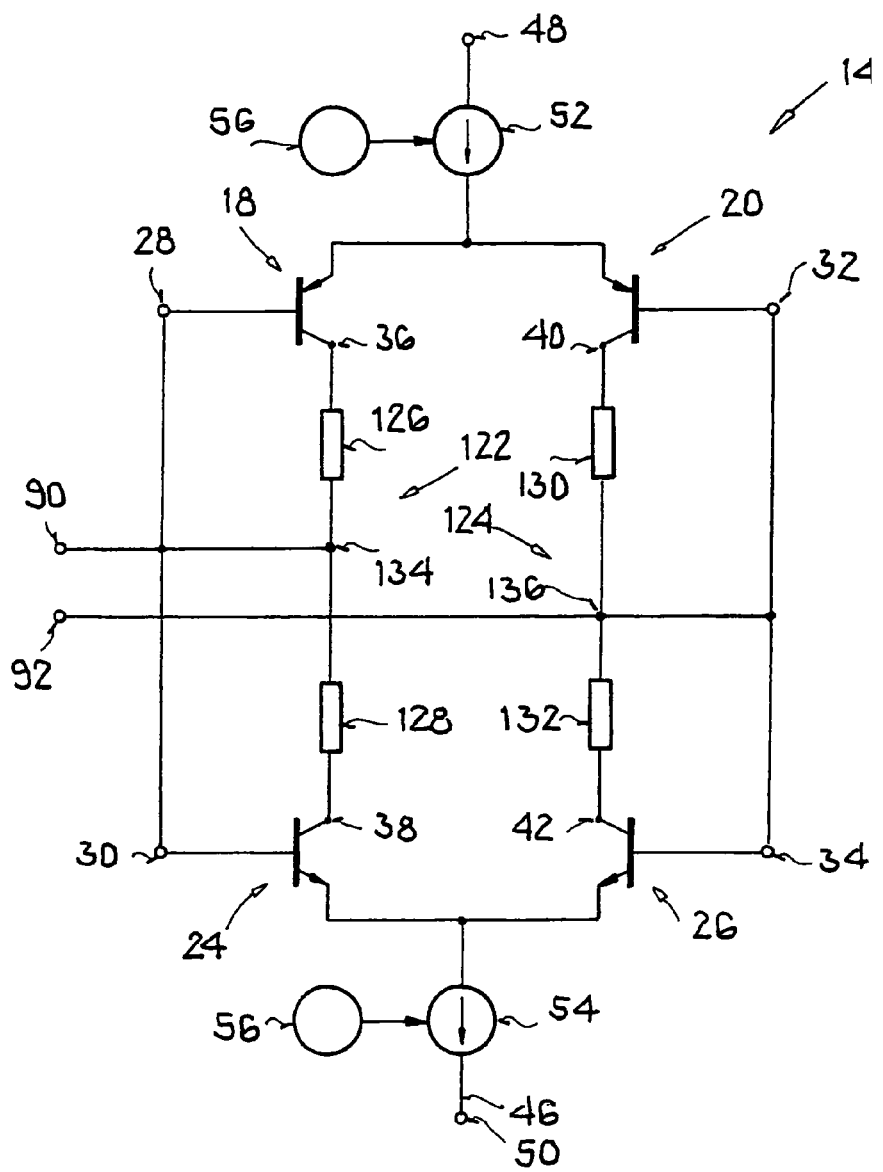
FIG. 4 shows another embodiment of a tunable capacitance.

FIG. 4 shows another embodiment of a tunable capacitance 14 having a first series connection 122 and a second series connection 124 having two resistances 126, 128 and 130, 132 each. In this context, the first series connection 122 joins the second current connections 36, 38 of the first transistor 18 and the third transistor 24, and the second series connection 124 joins the second current connections 40, 42 of the second transistor 20 and the fourth transistor 26. These series connections 122, 124 make it possible to optimize the tuning ranges of the variable capacitance 14 for the relevant application. In this context, in one embodiment a center tap 134 of the first series connection 122 is connected to the control connections 28, 30 of the first transistor 18 and the third transistor 24, and a center tap 136 of the second series connection 124 is connected to the control connections 32, 34 of the second transistor 20 and the fourth transistor 26. This measure makes it possible in the case of bipolar transistors, for example, to implement the aforementioned short circuiting of base-collector capacitances by simple circuit design means.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. An oscillator having a resonant circuit that includes at least one inductance device and at least one tunable capacitance, wherein the tunable capacitance is implemented through diffusion capacitances of at least one current-carrying transistor,
    wherein the tunable capacitance comprises:
        a first differential amplifier having a first transistor and a second transistor; and
        a second differential amplifier having a third transistor and a fourth transistor,
    wherein electrical properties of the first transistor and second transistor are complementary to electrical properties of the third transistor and fourth transistor,
    wherein control connections of the first transistor and the complementary third transistor are connected to one another,
    wherein control connections of the second transistor and the complementary fourth transistor are connected to one another,
    wherein second current connections of the first transistor and the third transistor are connected to one another, and
    wherein second current connections of the second transistor and the fourth transistor are connected to one another.

2. The oscillator according to claim 1, wherein the inductance device and the tunable capacitance are connected in parallel with one another.

3. The oscillator according to claim 1, wherein the arrangement of the first differential amplifier and second differential amplifier is wired in series between a first direct current source and a second direct current source, and wherein the first direct current source feeds a current of variable magnitude into the arrangement and the second direct current source draws a current of variable magnitude out of the arrangement.

4. The oscillator according to claim 3, wherein magnitudes of the currents supplied by the first direct current source and the second direct current source are equal.

5. The oscillator according to claim 4, wherein the first direct current source is connected to first current connections of the first and second transistors, and wherein the second direct current source is connected to first current connections of the third and fourth transistors.

6. The oscillator according to claim 1, wherein bipolar transistors are used as the first transistor, second transistor, third transistor and fourth transistor, wherein a base of each of the transistors functions as the control connection, wherein an emitter connection of each of the transistors functions as the first current connection, and wherein a collector of each of the transistors functions as the second current connection.

7. The oscillator according to claim 1, wherein field-effect transistors are used as the first transistor, second transistor, third transistor and fourth transistor, wherein a gate terminal of each of the transistors functions as the control connection, wherein a source terminal of each of the transistors or a drain terminal of each of the transistors functions as the first current connection, and wherein a drain terminal or source terminal of each of the transistors functions as the second current connection.

8. The oscillator according to claim 1, further comprising a negative resistance that compensates the resonant circuit.

9. The oscillator according to claim 1, wherein the inductance device and the capacitance are connected in parallel between a first supply voltage and the negative resistance.

10. The oscillator according to claim 1, wherein the control connection of at least one of the transistors is connected to the second current connection of another transistor.

11. The oscillator according to claim 1, wherein the inductance device is divided into at least one first partial inductance device and at least one second partial inductance device.

12. The oscillator according to claim 8, wherein the negative resistance is a third differential amplifier having a fifth transistor, a sixth transistor, and a constant current source, wherein a second current connection of the fifth transistor and a control connection of the sixth transistor are connected to a first partial inductance device, and a second current connection of the sixth transistor and a control connection of the fifth transistor are connected to a second partial inductance device, and wherein the constant current source is connected between first current connections of the fifth and sixth transistors and a second supply voltage.

13. The oscillator according to claim 12, wherein an additional capacitance is wired between the second current connections of the fifth and sixth transistors.

14. The oscillator according to claim 10, wherein an ohmic resistance is connected between the first supply voltage and a parallel circuit formed by the inductance device and tunable capacitance.

15. The oscillator according to claim 1, wherein a first series connection and a second series connection has two resistances each, wherein the first series connection joins the second current connections of the first transistor and of the third transistor to one another, and wherein the second series connection joins the second current connections of the second transistor and of the fourth transistor to one another.

16. The oscillator according to claim 15, wherein a center tap of the first series connection is connected to the control connections of the first transistor and the third transistor, and wherein a center tap of the second series connection is connected to the control connections of the second transistor and fourth transistor.

17. A variable oscillator circuit, comprising:
    a tunable capacitor functionally coupled to a control unit which sets a resonant frequency of oscillation; and
    at least one inductance device being connected in parallel to the tunable capacitor,
    wherein the tunable capacitor further comprises:
        a first differential amplifier driven by a control current from a first current source, wherein the control current is set by the control unit to vary a diffusion capacitance within the first differential amplifier; and
        a second differential amplifier coupled in series with the first differential amplifier, wherein the second differential amplifier is driven by the control current from a second current source controlled by the control unit, to vary a diffusion capacitance within the second differential amplifier, further wherein the second differential amplifier includes active devices which are complementary to active devices within the first differential amplifier.

18. A method for generating a resonant frequency, the method comprising the steps of:
  providing a control current to drive a first differential amplifier and a second differential amplifier, wherein active devices of the first differential amplifier are complementary to the active devices of the second differential amplifier;
  varying the control current to change diffusion capacitances of the first and second differential amplifier; and
  generating an oscillation current using the first and second differential amplifiers and at least one inductive device.

* * * * *